(12) United States Patent
Doll et al.

(10) Patent No.: US 10,842,040 B2
(45) Date of Patent: Nov. 17, 2020

(54) FLEXIBLE AND ADAPTABLE COMPUTING SYSTEM INFRASTRUCTURE

(71) Applicant: Cray Inc., Seattle, WA (US)

(72) Inventors: Wade Doll, Seattle, WA (US); Corey Knudsen, Chippewa Falls, WI (US); Dale Sand, Chippewa Falls, WI (US); Eric Lakin, Chippewa Falls, WI (US); Perry Franz, Chippewa Falls, WI (US); Paul Bonstrom, Chippewa Falls, WI (US); Rob Rongstad, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/499,209

(22) PCT Filed: Mar. 27, 2018

(86) PCT No.: PCT/US2018/024676
§ 371 (c)(1),
(2) Date: Sep. 27, 2019

(87) PCT Pub. No.: WO2018/183402
PCT Pub. Date: Oct. 4, 2018

(65) Prior Publication Data
US 2020/0214164 A1 Jul. 2, 2020

Related U.S. Application Data

(60) Provisional application No. 62/477,309, filed on Mar. 27, 2017.

(51) Int. Cl.
*H05K 7/14* (2006.01)
*G06F 1/28* (2006.01)
(Continued)

(52) U.S. Cl.
CPC .......... *H05K 7/1492* (2013.01); *G06F 1/266* (2013.01); *G06F 1/28* (2013.01); *H04Q 1/025* (2013.01);
(Continued)

(58) Field of Classification Search
None
See application file for complete search history.

(56) References Cited

U.S. PATENT DOCUMENTS

| 6,985,357 B2 * | 1/2006 | Cauthron | G06F 1/181 312/223.1 |
| 7,234,964 B1 * | 6/2007 | Karstens | G06F 1/181 439/490 |

(Continued)

*Primary Examiner* — Mukundbhai G Patel
(74) *Attorney, Agent, or Firm* — Hewlett Packard Enterprise Patent Department

(57) ABSTRACT

To achieve multiple benefits, a high speed computing system is configured in a hierarchical manner with flexibility and re-configurability concerns maximized. This begins with a particular cabinet architecture which is specifically designed to accommodate various needs and considerations. The cabinet or rack is designed to receive various chassis assemblies depending on the particular needs and or functions involved. These may include a compute chassis, a switch chassis, or a rectifier chassis, which can be incorporated into the cabinet. Within each chassis, specific components are then inserted, with each of these components being in a subsystem configuration. For example, the compute chassis is specifically designed to receive a number of compute blades. Similarly, the switch chassis is designed to receive a number of switch blades. Lastly, the rectifier chassis is configured to receive a number of rectifiers. Collectively, the multiple blades and chassis are all configured to cooperate with one another in an efficient manner. While various (Continued)

subassemblies are utilized, the cabinet or rack does accommodate certain centralized functions such as cooling and power distribution.

14 Claims, 16 Drawing Sheets

(51) Int. Cl.
  G06F 1/26 (2006.01)
  H04Q 1/02 (2006.01)
  H05K 7/20 (2006.01)
(52) U.S. Cl.
  CPC .............. *H04Q 1/03* (2013.01); *H04Q 1/035* (2013.01); *H05K 7/1489* (2013.01); *H05K 7/20781* (2013.01)

(56) References Cited

U.S. PATENT DOCUMENTS

| 2007/0002536 A1* | 1/2007 | Hall | G06F 1/20 361/695 |
| 2013/0135811 A1* | 5/2013 | Dunwoody | H05K 7/20818 361/679.31 |
| 2017/0164504 A1* | 6/2017 | Blume | H05K 7/20781 |

* cited by examiner

FLEXIBLE AND ADAPTABLE COMPUTING SYSTEM INFRASTRUCTURE

BACKGROUND

High performance computing systems (or highly capable computing systems) have many unique needs, concerns and demands including power issues, component cooling, and physical space issues. These systems typically include multiple processors working in conjunction with one another, and thus require significant communication interfaces, and large memory needs. Additionally, all of the components or systems require space, power supplies, and heating/cooling structures. The efficient operation and use of these systems can be challenging, especially when the actual systems are custom designed, and the facilities vary considerably. Further, there are often needs to modify the scale of a particular system to increase capacity. As such, a flexible and adaptable approach is necessary.

As mentioned, high computing systems require certain levels of computing power to meet the computing needs required to carry out assigned tasks. With this need, carefully designed power systems are necessary. When looking at various system configurations and custom installations, however, there are many additional details which must be addressed. These details can often include: (1) physical structures needed to house the necessary electronic components; (2) housings and interconnects for communication components; (3) appropriate heating and cooling accommodations; and (4) overall system controls to provide coordinated operation of the various components.

In addition to the particular needs of any computing installation, it is obviously desirable from a manufacturing standpoint to have common components and interchangeable structures, thus minimizing manufacturing costs and expenses. In addition, system expansion must be considered so the system has the ability to deal with continuous changes in computing needs. As such, structures, components and devices which are adaptable, expandable and reusable are very beneficial. For example, a physical rack system which can accommodate removable computing components, communication components, and other electronic components is a beneficial and highly desirable structure. Further, such a rack system which accommodates virtually any physical layout is also extremely helpful. For example, one beneficial system may include heating and cooling infrastructure that is supplied in many different ways. More specifically, heating and cooling equipment may provide appropriate air/liquid, or other cooling sources from above, below, or the side of a specific cabinet itself. Systems which can accommodate any and all of these various configurations are thus helpful, desirable and extremely efficient.

In addition to the details outlined above, the efficient use of floor space within a computing facility can often be a concern. This often translates to overall efficiency and effectiveness of the high performance computing systems. As such, it is often beneficial to provide structures that are optimized for the efficient use of floor space.

SUMMARY

To provide considerable flexibility and options for users when configuring large scale computing systems, an infrastructure approach has been developed which is adaptable and easily configurable to meet the needs of system designers. Using this approach, a cabinet is configured to have only essential components, leaving the ability for multiple functions to be carried out by removable and replaceable components. In addition, the placement and orientation of components within the cabinet is optimized so that the cabinet footprint is minimized to efficiently make use of floor space within a computing facility. In this way, various system configurations, and computing approaches can be easily implemented using one reliable cabinet configuration.

BRIEF DESCRIPTION OF THE DRAWINGS

Several advantages and benefits of the preferred embodiments are set forth below, in conjunction with the following drawings in which.

DESCRIPTION OF THE VARIOUS EMBODIMENTS

Various functions and details are described below in relation to particular embodiments. It will be clearly understood that these embodiments illustrate one approach to carrying out the overall goals of a flexible and adaptable computing system infrastructure. While there are other specific approaches which could be utilized, the illustrated embodiments set forth various advantages and benefits provided.

In the various embodiments outlined below, a highly flexible, adaptable and expandable computing system architecture is described and disclosed. As will be recognized by those skilled in the art, various features and capabilities are specifically designed into these embodiments, thus allowing for flexible installation in virtually any computing facility, while also allowing various configurations to meet a broad range of processing needs.

To achieve multiple benefits, the various embodiments of the system are generally configured in a hierarchical manner with flexibility and re-configurability concerns maximized. This begins with a particular cabinet architecture which is specifically designed to accommodate various needs and considerations. The cabinet or rack is designed to receive various chassis assemblies depending on the particular needs and or functions involved. For example, a compute chassis, a switch chassis, or a rectifier chassis, can be incorporated into the cabinet. Within each chassis, specific components are then inserted, with each of these components being in a subsystem configuration. For example, the compute chassis is specifically designed to receive a number of compute blades. Similarly, the switch chassis is designed to receive a number of switch blades. Lastly, the rectifier chassis is configured to receive a number of rectifiers. Collectively, the multiple blades and chassis are all configured to cooperate with one another in an efficient manner. While various subassemblies are utilized, the cabinet or rack does accommodate certain centralized functions such as cooling and power distribution.

As set forth in further detail below, the design of all components and specific design considerations for the overall system, result in an efficient, flexible and adaptable computing system architecture. Although various details of the multiple embodiments are disclosed, they are generally summarized as a cabinet, shelf, chassis, power module, and blade architecture for various embodiments of a high capacity computing system.

Figure 1:
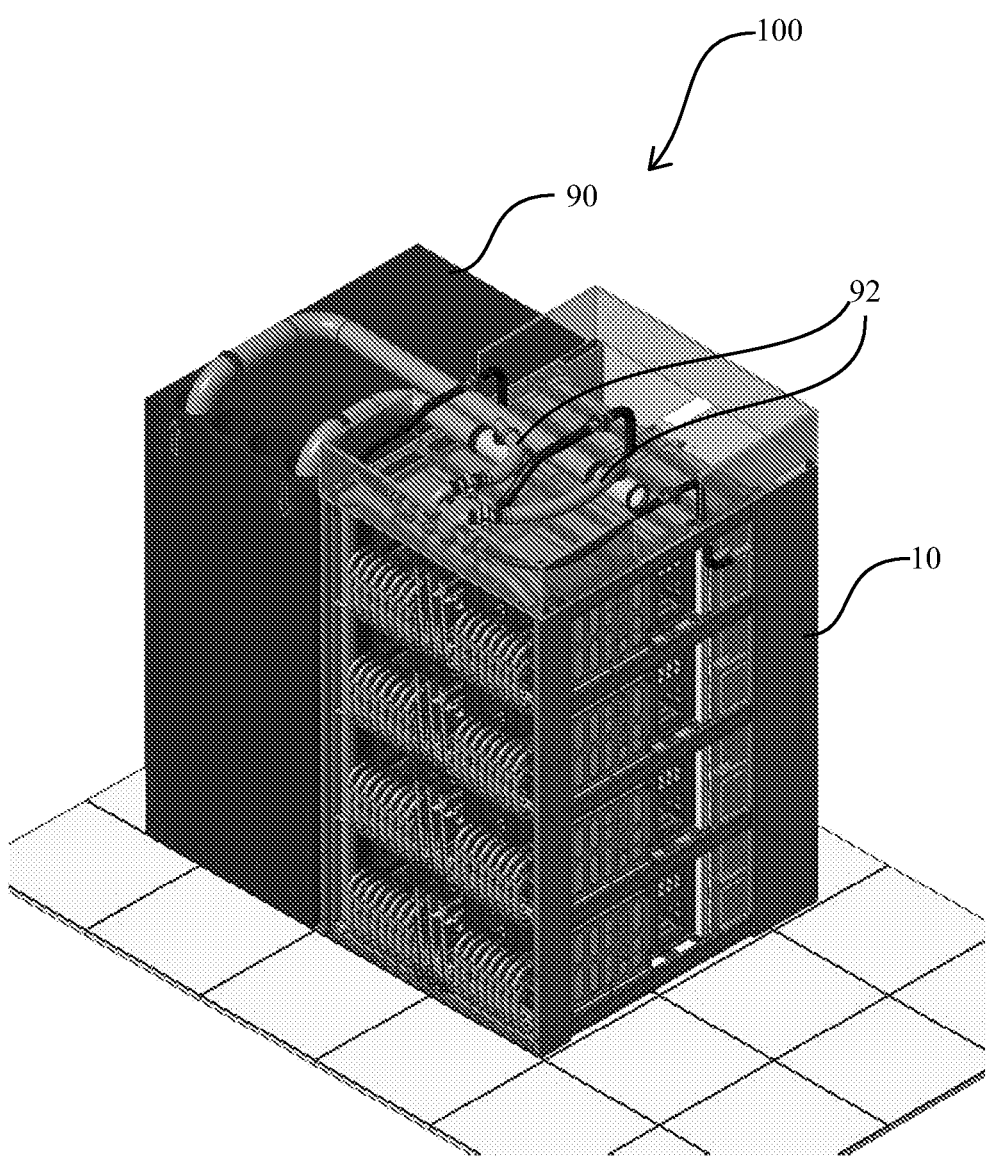
FIG. 1 is a perspective view of one embodiment of a computing system.

Referring now to FIG. 1, the basic components of one embodiment are illustrated. More specifically, FIG. 1 shows one embodiment of a high performance computing system 100. As illustrated, high performance computing system 100 includes a compute cabinet 10, and a cooling system or cooling distribution unit (CDU) 90. As will be further discussed below, compute cabinet 10 is specifically configured to be adaptable, reconfigurable, and expandable depending on the particular needs involved. Further, cooling system 90 also provides the capabilities to serve a single compute cabinet, or multiple compute cabinets installed at a single location based upon a common architecture strategy.

Compute cabinet 10 is optimized for density, power, cooling, scalability, and future upgradability. In this embodiment, compute cabinet 10 supports direct warm water liquid cooling and high voltage (400-480V) 3-phase AC power input. Compute cabinet architecture also allows for vertical compute blades to be installed from the front, and connected orthogonally to horizontal switch blades to be installed from the rear. Further, this embodiment includes a cabinet 10 which is approximately 46.5" wide and 56" deep. As shown, compute cabinet 10 spans two tiles in width and maintains a traditional four-tile pitch from row-to-row. In addition, this embodiment has an installed height with overhead piping of 91" with a removable top to reduce the height to 81" for installation into facilities with low clearances. Cooling fluid and facility power can be supplied to the top or the bottom of the cabinet. It will be understood that a slimmer cabinet, only one tile wide, could also be used.

Figure 2:
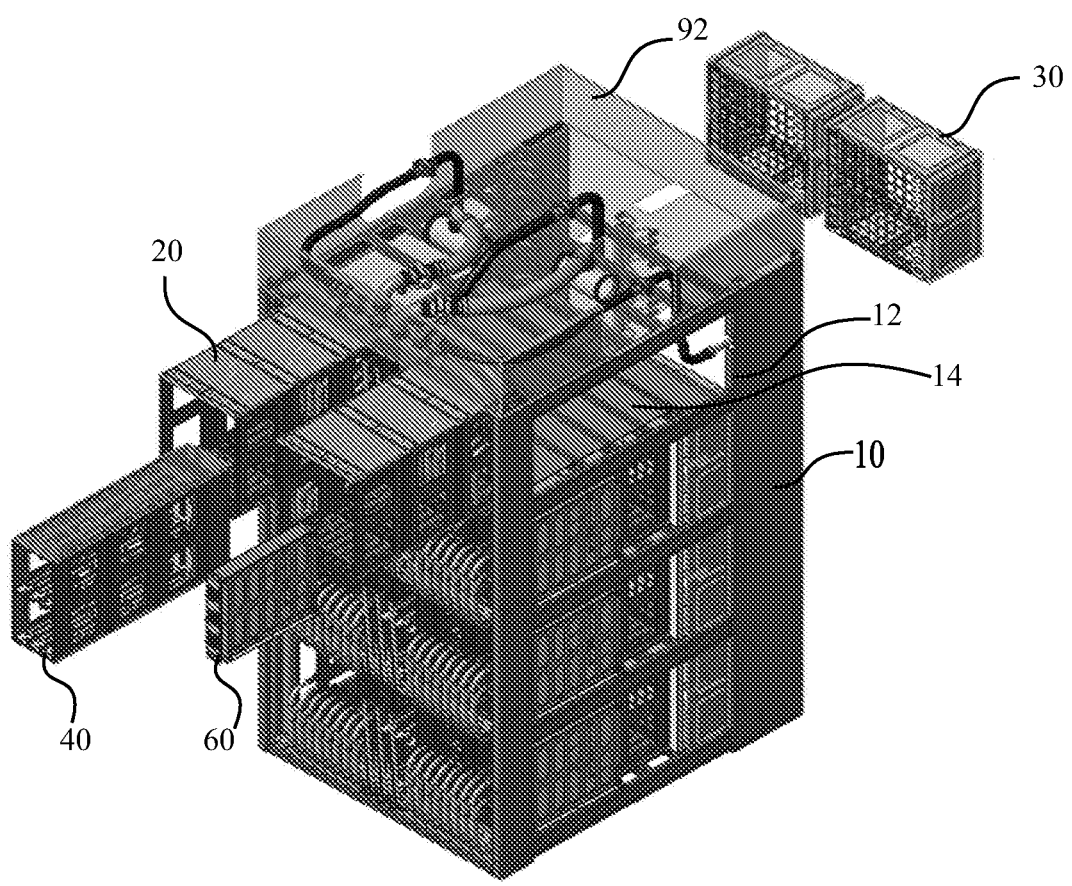
FIG. 2 is a perspective exploded view of a computing cabinet.

Turning now to FIG. 2, compute cabinet 10 is further illustrated, with various chassis elements illustrated in exploded view. As will be discussed below in further detail, compute cabinet 10 is specifically configured to accommodate at least one compute chassis 20, at least one switch chassis 30, at least one rectifier chassis 40, and at least one chassis management module 50. Further, compute cabinet 10 is specifically configured to include a rack framework 12 which includes a number of shelves 14. As illustrated in FIGS. 1 and 2, overhead fluid handling components 92 are also coupled to compute cabinet 10 which cooperate with cooling system 90, so that fluid is appropriately directed throughout the components contained with compute cabinet 10.

As mentioned above, the framework or rack structure 12 is configured to have a number of shelves 14. In the particular embodiment illustrated, four shelves are utilized. Further, this embodiment includes the ability to house two (2) compute chassis 20, two (2) switch chassis 30, one rectifier chassis 40 and two (2) chassis management modules 50, all supported by a single shelf. As will be further discussed below, each chassis has further structures necessary to support the functions of the particular components. It is contemplated that rack system 12 and the various chassis components themselves do not necessarily include internal interconnect components, or power supply elements. In this manner, the methodology utilized allows for easy removal and reconfiguration of system components, at a component level, without requiring adjustments to interconnect networks, back planes, or other structures typically found in compute cabinets.

Figure 3:
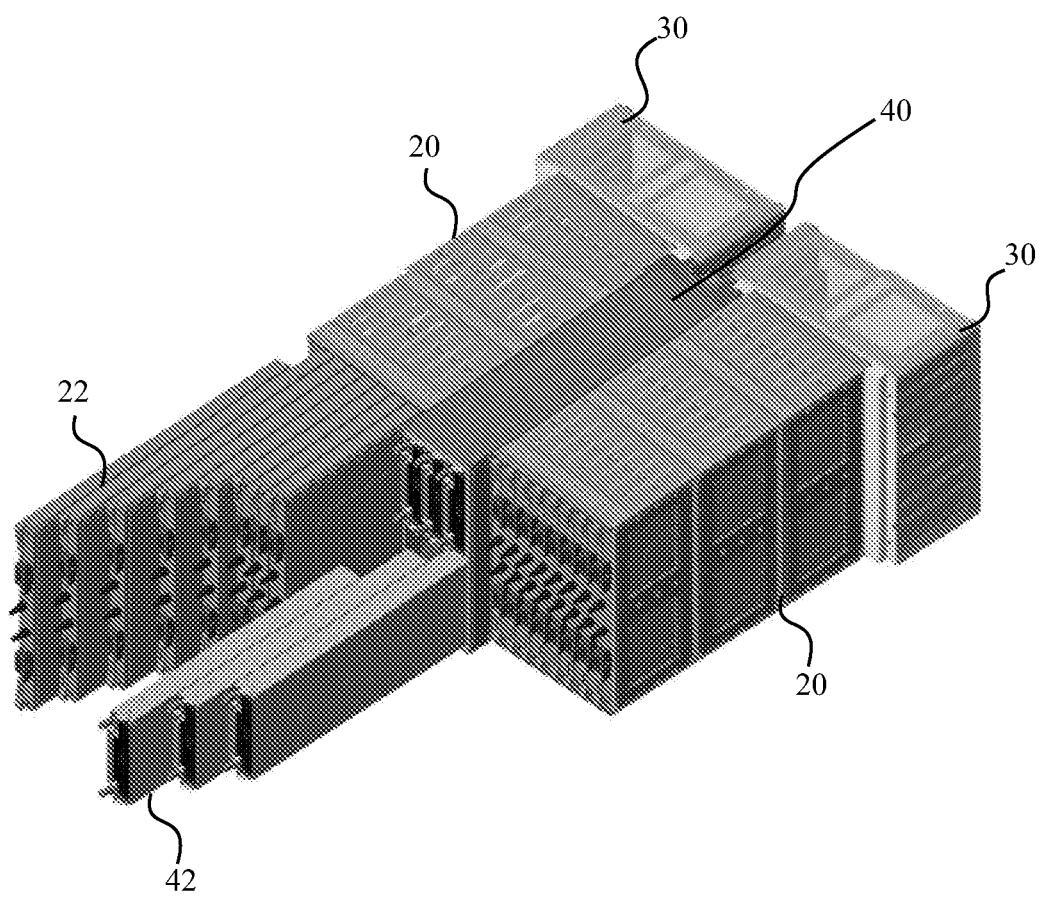
FIG. 3 is a perspective exploded view of a shelf.
Figure 4:
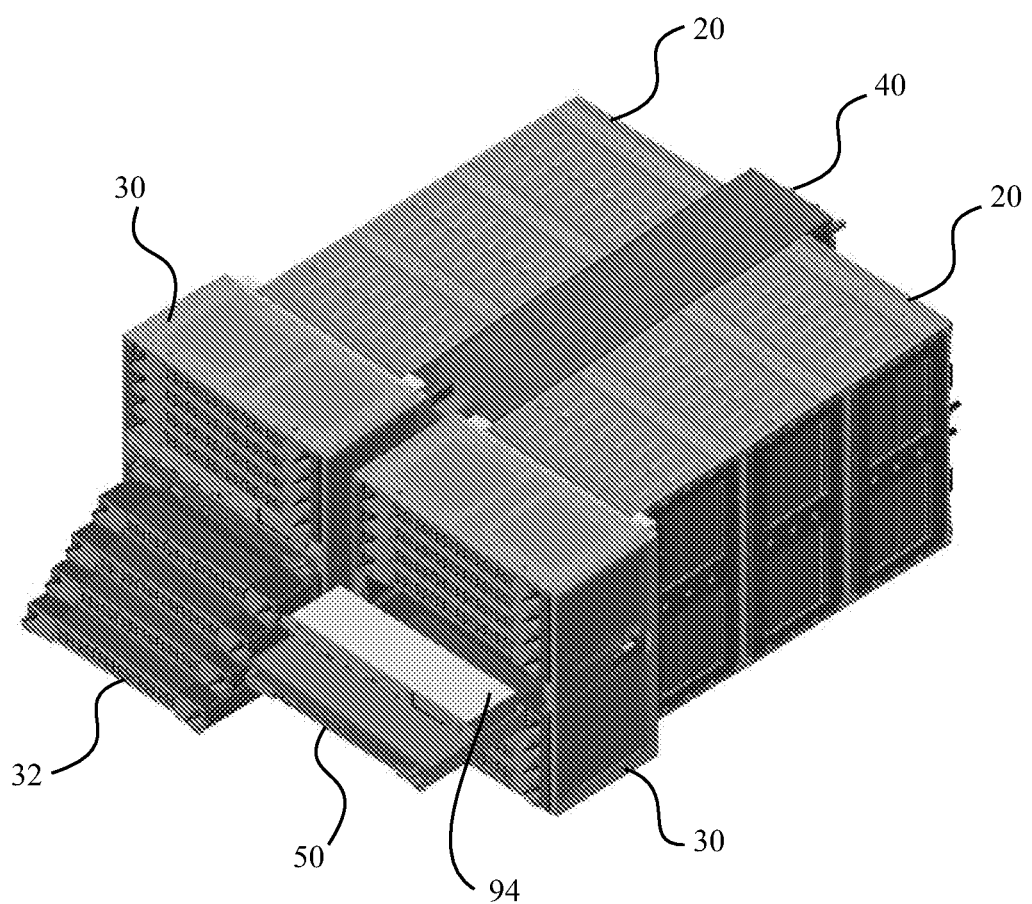
FIG. 4 is a rear exploded perspective view of a shelf.

As shown in FIGS. 2-4, and as further detailed below, each compute cabinet 10 supports sixty-four (64) compute blades 22 that are serviced from the front of rack 10 without requiring a lift. The front of the cabinet also houses a cooling fluid distribution manifold 110 (best illustrated in FIG. 5), coupled via dry-break quick connects to compute blades 22. As also detailed below, certain power delivery systems and safety features are also accessed from the front, including access to both the rectifiers 42 and breakers 44.

In addition to the compute blades 22 discussed above, compute cabinet 10 supports up to sixty-four (64) switch blades 32 that are serviced from the rear of rack 12. This configuration may populate thirty-two (32) of these blades 32 for a single data plane, with expansion to 2 full data planes as an option. The switch blades 32 are orthogonally oriented to the compute blades 32 and plug in directly. The number of switch blades 32 varies to support the desired injection, intra-group, and global bandwidths. The fabric interconnect is organized into three columns, which allows easy access to switch blades 32 without disturbing adjacent cabling.

It is significant that switch chassis 30 could also support alternative components, depending upon customer requests and/or requirements. For example, switch chassis could be used to support flash storage blades, IO blades or other expansion blades. These alternative components are easily supported and integrated into the overall system since they are able to use the same connection methodology to provide a direct connection to the plurality of compute blades 22. In addition, power and cooling resources are also available to any of these alternative components, making the incorporation of these alternative resources very convenient.

For this design, each cabinet represents a local group in the Dragonfly topology. These groups consist of 512 nodes with 32 switches. A group size this large allows jobs of 512 or fewer nodes to have fully all-to-all connectivity.

Consistent with the description above, cabinet 10 is segmented into eight chassis pairs, with each being divided into a compute portion and switch portion. Again, a pair of chassis resides on a shelf and are separated by rectifier chassis 40, which supports power rectifiers 42. The quantity of rectifiers 42 is dictated by the cabinet power level and N+1 redundancy.

In addition to the orthogonal switch blades, the switch chassis 30 contains the chassis management module (CMM) 50 and the uppermost chassis also contains the cabinet environment controller (CEC) 94. The CMM 50 provides all hardware supervisory services to the chassis whereas the CEC 94 provides rack-level monitoring and control of environmental conditions.

As set forth above, the specific architectural strategy utilized provides a computing system that is both scalable, and easily manufactured. As indicated, specific accommodation allow for each chassis to hold a cabinet environmental controller, although only two of these controllers is required per cabinet. In addition, each chassis can include a chassis management module. That said, the chassis management module is designed and configured to coordinate operation of pairs of chassis, thus, not being required in each particular switch chassis involved. As will also be appreciated, this design, utilizing multiple chassis for various sets of components, could be easily configurable in other manners. For example, each shelf could be configured to contain sets of four compute chassis, and four switch chassis, etc. The above-mentioned arrangement provides efficient use of space and well-accepted cabinet sizes, thus is particularly beneficial. That said, other designs or configurations could be equally beneficial.

One additional aspect of the overall architecture is packaging the boards into a blade. These blades represent a higher level component of the compute system and include additional details. The blade includes additional mechanical infrastructure housing the board, and may also include additional power or thermal-solution components. The blade is the first level of a field replaceable unit and would be what is removed from the chassis or cabinet as required.

Figure 6:
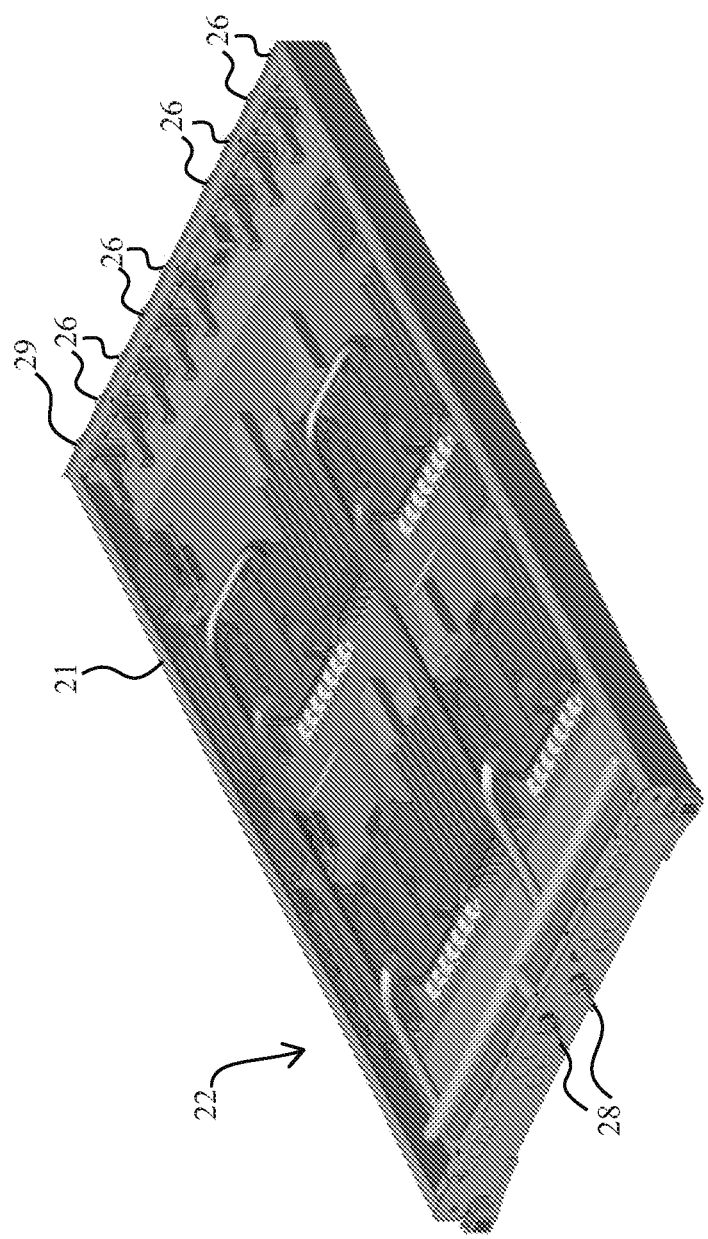
FIG. 6 is a top view of a compute blade.

In one particular embodiment, the physical dimensions of compute blade 22 is approximately 1.5"×17.5"×32", and it weighs approximately 35 lbs. Referring to FIG. 6, a top view of an exemplary compute blade 22 is illustrated. As shown, compute blade 22 contains drip-free fluid connectors 28 at the front for liquid cooling, along with L0 network connectors 26, power connectors 24, and HSS connector 29 at the rear. The blade structure includes a physical container or housing 21 which creates the EMI boundary.

As will be recognized, compute blade 22 is the module that houses the main processing element of the system. Compute blade 22 generally consists of the following major components:

- A Node Card, which is a printed circuit assembly (PCA) that houses the multiple nodes (i.e. CPU, memory) and supporting chipsets, voltage regulators, IVOCs and management controller.
- A Node Cardlet, which is also a printed circuit assembly (PCA) that houses the nodes (CPU, memory) and supporting chipsets, voltage regulators, IVOCs, but does not include the management controller. A given compute blade 22 may house either a Node card or a Node cardlet, depending on the needs, but not both.
- Intermediate voltage converters (IVOCs), which are power supplies that convert input 380V to the appropriate low voltage.
- High Speed Network (HSN) cables, which provide an interface between the node and the switches on the switch blades 32. In some configurations these may also be referred to as L0 cables.
- A power cable to deliver approximately 380V power to the IVOCs
- An HSS Cable that interfaces the Chassis Management Module (CMM) to the management complex on the Node card.
- An LED-switch board, which is a front panel like PCA that houses status LEDs visible from the face plate and a kill switch to disable power on blade ejection.
- An LED-switch cable that interfaces the Node card to the LED-switch board
- Cooling hardware, including mechanical infrastructure to provide cooling to the compute blade. This includes cooling caps or cooling clips or cold plates for high power elements such as the processors, memory, IVOCs as well as other lower powered devices that need cooling. This will also include cooling loops and manifolds to physically circulate the liquid through the various cooling hardware.
- Leak sensors to detect leaks in a blade.
- The mechanical enclosure, with provides the physical framework to house all of the above using various mounting hardware forming the Compute Blade which fits within a given compute blade slot.

Those skilled in the art will recognize that the compute system 100 is configured to support many different types of compute blades 22, which can be designed around various processor technologies. As a result the number of nodes on a given node card will vary. Further, a node can be comprised of a different number of sockets. In some cases there can be multiple nodes in a socket.

Figure 7:
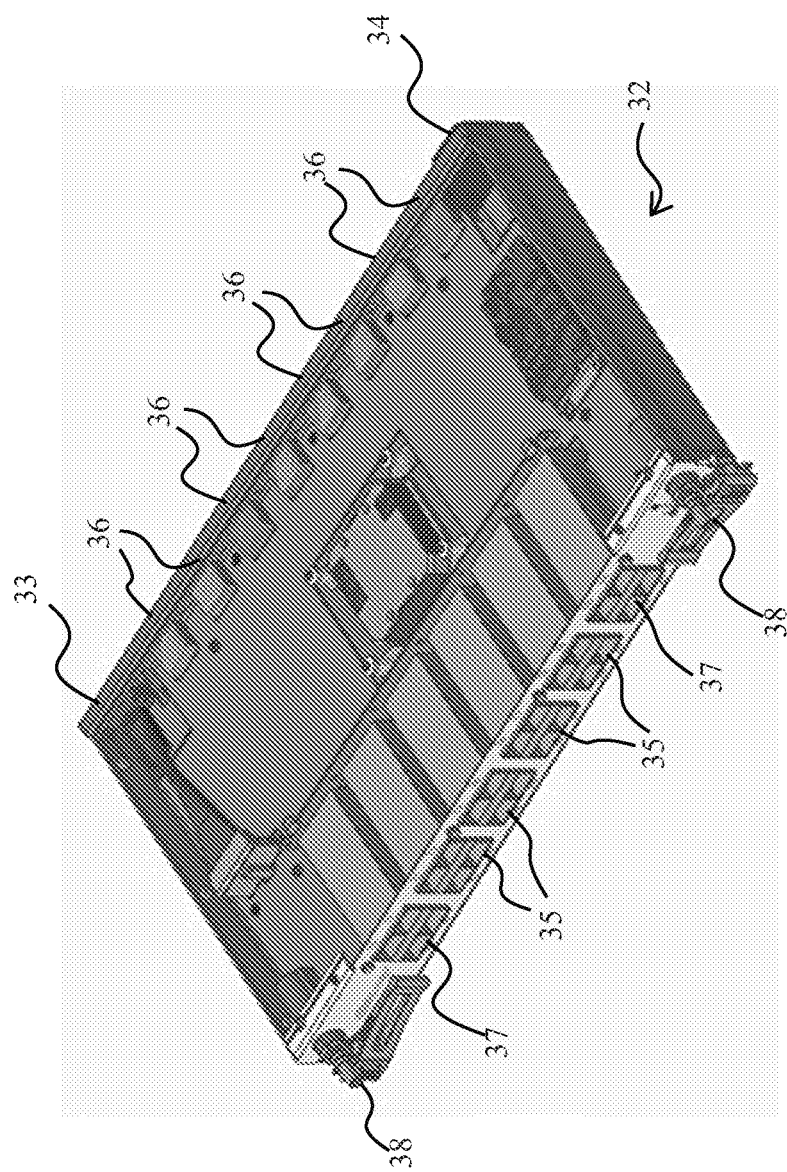
FIG. 7 is a top view of a switch blade.

As generally shown in FIG. 7, switch blade 30 contains one switch ASIC (not shown) that is centrally located on the blade with 16 down links (L0), 32 group links (L1), and 16 global links (L2). The L1 and L2 cables are commodity QSFP-DD (×8) cables. In this embodiment, the blade envelope is 1.5"×19.0"×12.0" and contains the switch ASIC, cable connectors 35, voltage converters, hardware supervisory system, and direct liquid cooling connectors 38 (and related cooling hardware).

As generally illustrated in FIG. 7, interface connectors 36 are positioned on a first side of switch blade 32. Again, interface connectors 36 are configured to connect with the above-mentioned compute blades 22, and provide appropriate communication capabilities. Further, an opposite side of switch blade 32 includes a power connector 34, situated to receive power signals as will be discussed in further detail below, along with an HSS connector 33. On an opposite side, the drip-free fluid connectors 38 are situated to receive appropriate cooling fluid. Switch blade 32 includes internal structures such as fluid handling mechanisms and cold plates to appropriately provide cooling capabilities. As will be recognized, these cooling structures often include cold plates situated directly upon related electronic components to sufficiently draw heat away. Also situated on this side of switch blade 32 are a number of cable connectors 35. As will be appreciated, these cable connectors will provide appropriate networking connections and related communication capabilities. Also included are a number of global links 37 to provide a further expansion of the computing systems. It is anticipated that these global links 37 will provide connections to related cabinets, in those situations where multiple cabinets are utilized for the high performance computing system.

In more detail, the switch blade is the module that houses the main switching element of the system. In one embodiment, switch blade 32 consists of the following major components:

- A Switch Card, which is a printed circuit assembly (PCA) that houses the switch, HSN interface connectors and supporting voltage regulators, IVOCs and management controller.
- An Intermediate Voltage Converter (IVOC), which again is a power supply that converts input 380V to the appropriate low voltage that can be used by the various components within switch blade 32.
- A power cable that delivers approximately 380V power to the IVOC.
- A HSS Cable that interfaces the Chassis Management Module (CMM) to the management complex on the Switch card.
- LED-switch board which is a front panel like PCA that houses status LEDs visible from the face plate and a kill switch to disable power on blade ejection.
- An LED-switch cable that interfaces between the Switch card and the LED-switch board.

Cooling hardware that provides the mechanical infrastructure for the switch blade 32, and which includes cooling caps or cooling clips or cold plates for high power elements such as the switch ASIC, IVOC as well as other lower powered devices that need cooling. This also includes cooling loops and manifolds to physically circulate the liquid through the various cooling hardware.

Leak sensors to detect leaks in a blade.

A mechanical enclosure to provide a mechanical framework that houses all of the above components using various mounting hardware, thus forming switch blade 32 which fits within a given switch blade slot.

The system may support many different types of Switch Blades designed around various network technologies. As a result, the number of switch ASICs on a given switch card will vary.

As mentioned above, switch chassis 30 supports both chassis management module (CMM) 50, and cabinet environmental control (CEC) 94.

The Chassis Management Module (CMM) 50 is the HSS control module that manages the entities in the chassis. There is one CMM in each chassis. The CMM is located in the switch blade side of the chassis in the fifth slot from the bottom, in between the switch blades. In this embodiment, CMM 50 includes:

A CMM PCA which houses the chassis management controller and peripherals, HSS Ethernet switch, HSS power IVOCs etc.

A pair of intermediate voltage converters (IVOCs) which again is a power supply that converts input 380V to the appropriate low voltage.

A power cable that delivers 380V power to the IVOC.

An LED-switch board, which is a front panel like PCA that houses status LEDs visible from the face plate and a kill switch to disable power on blade ejection.

An LED-switch cable that interfaces the Switch card to the LED-switch board

Cooling hardware, including all mechanical infrastructure such as cooling caps or cooling clips or cold plates for high power elements such as the controller, switch, IVOC as well as other lower powered devices that need cooling. It also includes cooling loops and manifolds to physically circulate the liquid through the various cooling hardware.

Leak sensors to detect leaks in a blade.

A mechanical enclosure that provides the mechanical framework which houses all of the above using various mounting hardware forming the Chassis Management Module which fits within the CMM slot.

Figure 14:
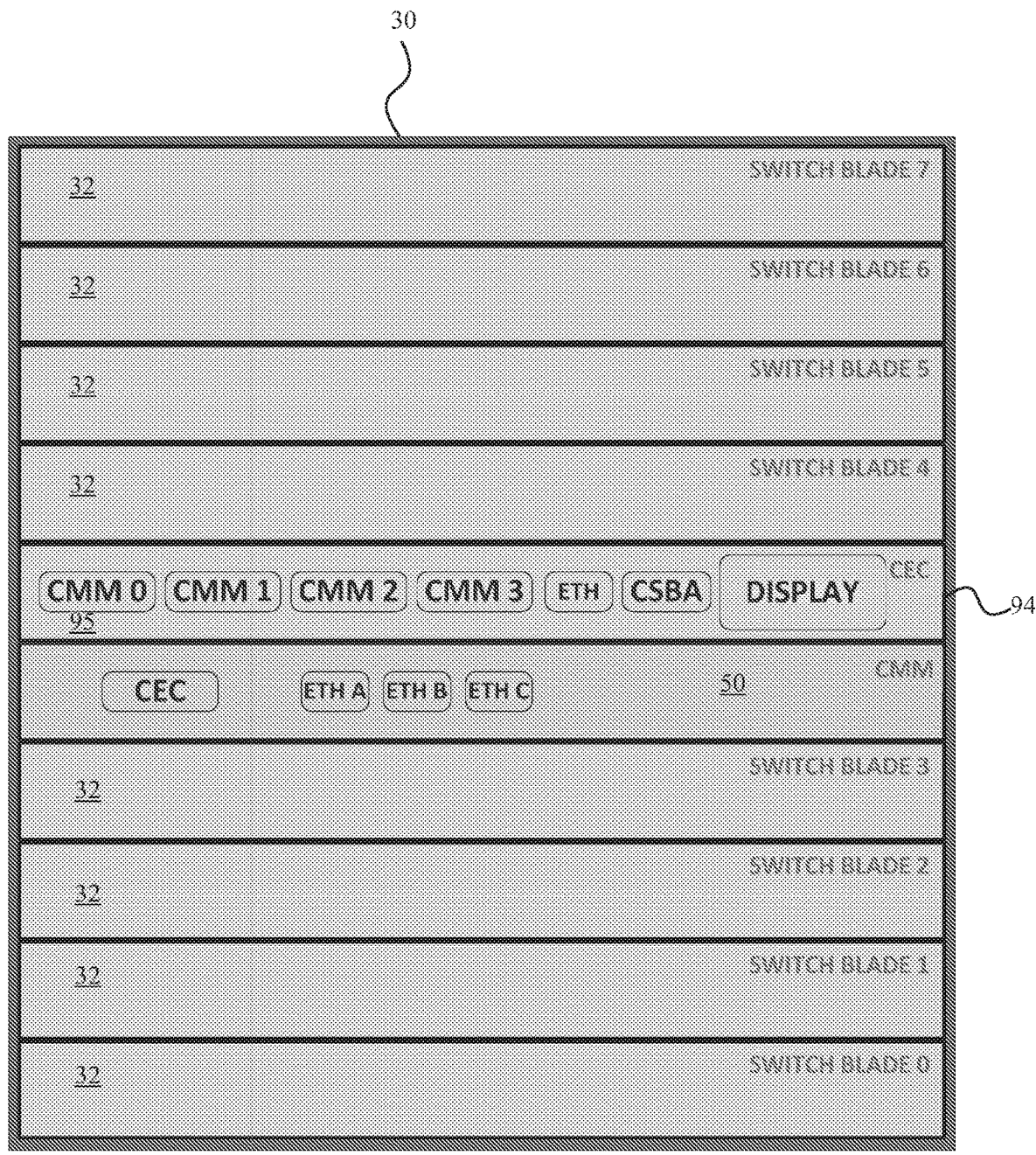
FIG. 14 is a front schematic view of a switch chassis.

In the illustrated embodiments shown in FIG. 14, the CMM faceplate 52 has four connectors. The left most connector is to interface with the CEC, while the other three are Gigabit Ethernet RJ45 connectors that provide multiple redundant downlinks to the chassis Ethernet network.

The Cabinet Environmental Control (CEC) module 94 is an offload-like environmental sensors and CDU adapter module for the CMMs 50. The CMMs 50 communicate with the CDUs and cabinet sensors through the CEC 94. There is one CEC 94 for four CMMs 50. CMMs 50 in one vertical half of the cabinet interface with the same CEC 94. The CECs 94 will be located in chassis' 4 and 5 on the switch blade side. The CEC 94 in the given chassis is located in the sixth slot from the bottom, right above the CMM. In one embodiment, the CEC includes:

A CEC printed circuit assembly (PCA) that houses the environmental controller and peripherals, Ethernet PHY, voltage regulators, CMM interface connectors etc.

An LCD display that allows user to enter and read cabinet information

A display cable that interfaces the CEC PCA to the display.

A mechanical enclosure providing the framework that houses all of the above using various mounting hardware forming the Cabinet Environmental Control module which fits within the CEC slot.

On the CEC faceplate 95 are six connectors as shown in FIG. 14. The four connectors are to interface with the four CMMs in the vertical half of the cabinet with CMM0 being the CMM in the lowest chassis and CMM3 being the CMM in the uppermost chassis. Next to the CMM connectors is an RJ45 jack that provides a 10/100 Ethernet downlink from the HSS Ethernet network. The other connector is to interface with Cabinet Sensor Breakout Assembly (CSBA) which is located above the cabinet and fans out the connections to the sensors and the CDU.

The cabinet 10 of this embodiment can support a sustained maximum of 300 Kilowatt (kW). The actual power draw is determined by the compute blade configuration, the quantity of switch blades, and the application running on it.

Figure 10A:
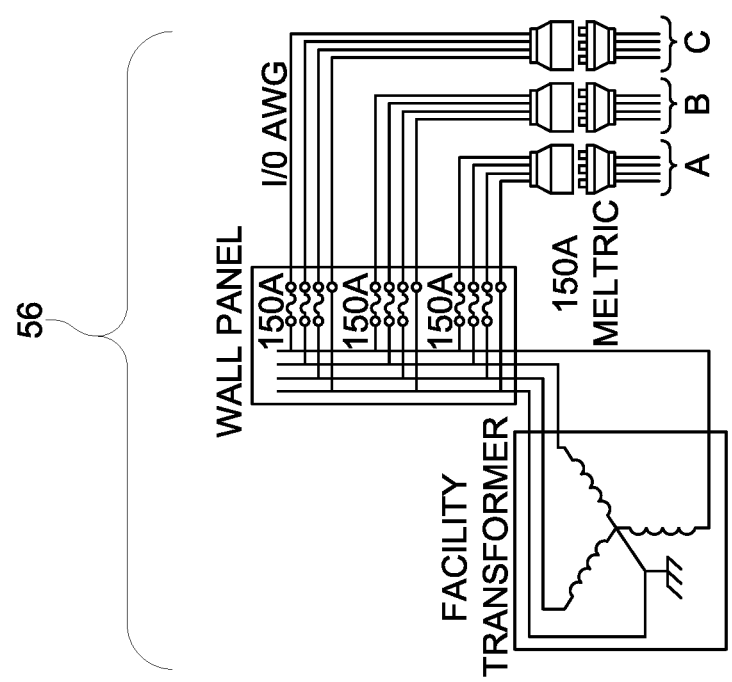
FIG. 10 is a schematic diagram of the power system.
Figure 10B:
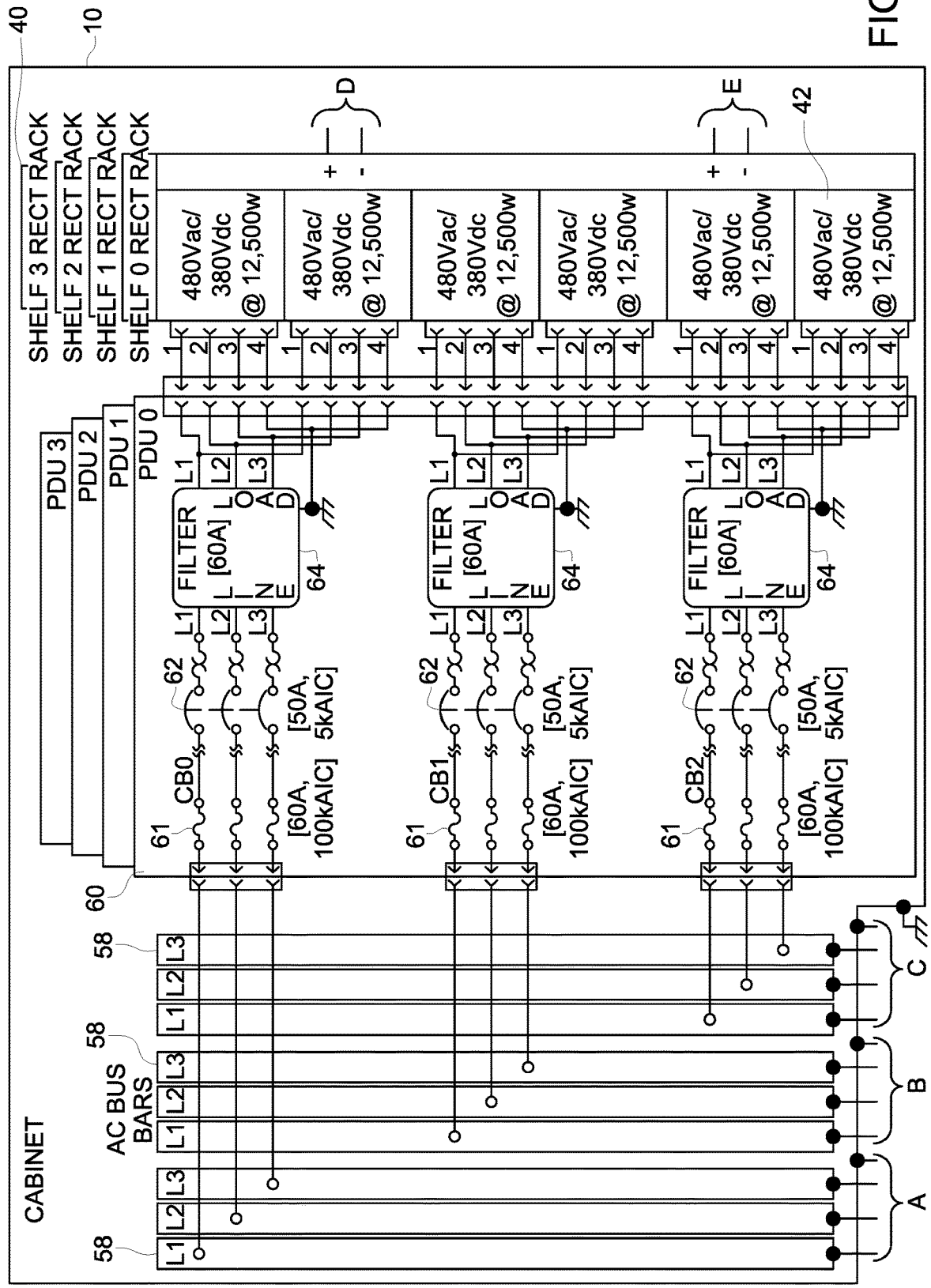
Figure 10C:
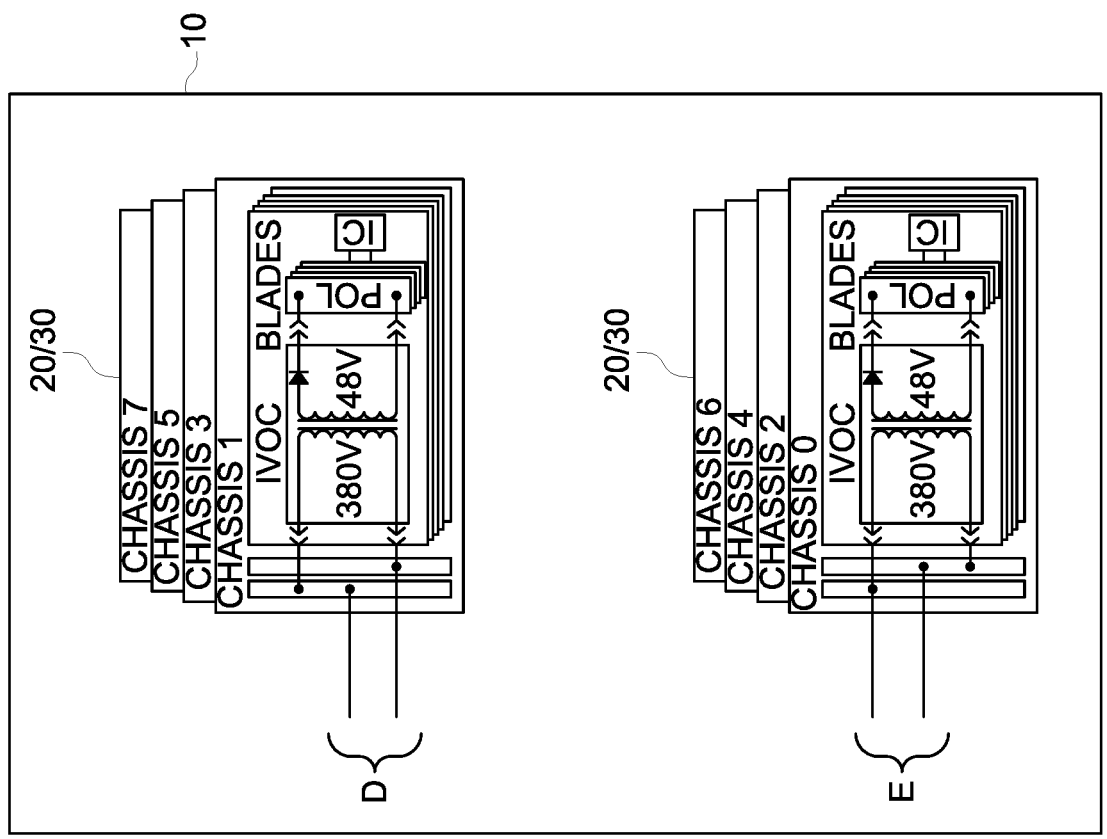
Figure 11:
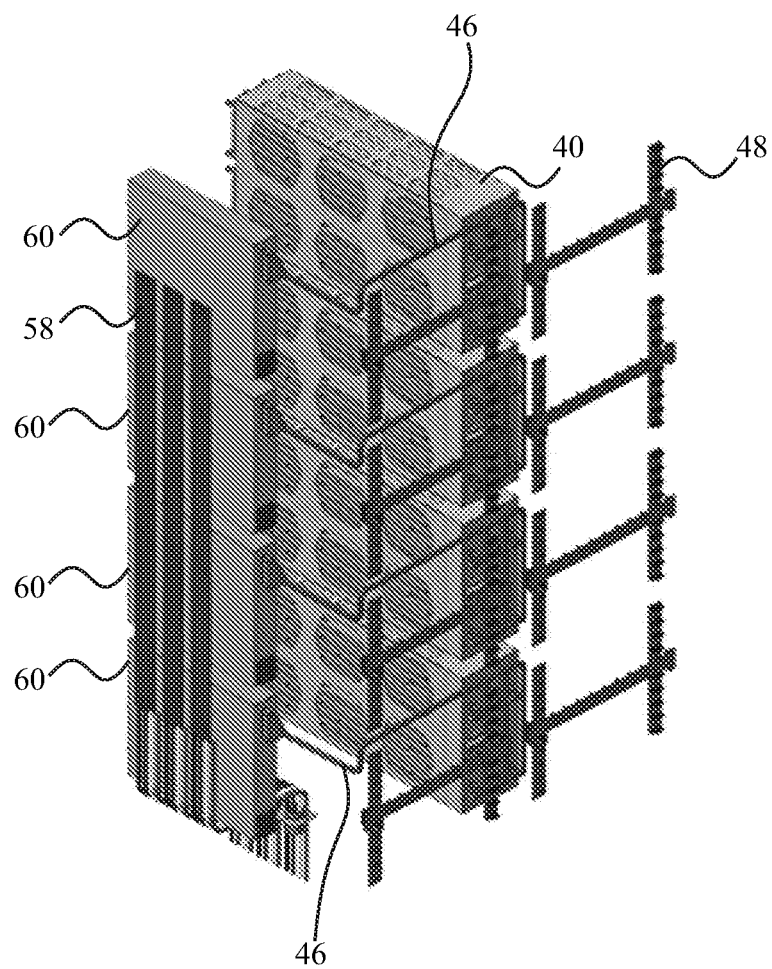
FIG. 11 is an exploded view of the components forming the power system.

The power architecture, as generally laid out in FIGS. 10-11, is designed to provide the maximum efficiency from the ac feeds to the point of load; in excess of 82%. The rack power feeds are configurable depending on the rack power requirements and to meet the facility needs. The primary options are: two 150 A 480 Vac, or three 100 A 480 Vac feeds. That said, additional alternatives may exist, including 125 A options, or any combination of these.

This system power feed has multiple advantages. Most importantly, the 480 Vac power level minimizes distribution losses and conversion steps associated with lower voltages. A second benefit is that the 3-phase power feed precludes the need to track phase balance, avoiding issues typical in a single-phase power distribution.

As schematically illustrated in FIG. 10, incoming alternating current (AC) power 56 connects to a PDU 60 in the cabinet that contains circuit breakers 62, fuses 61, and EMI filters 64. Incoming power 56 is received and connected to a plurality of bus bars 58 located within the cabinet.

The PDU 60 feeds a set of rectifiers 42 that are contained within rectifier chassis 40. This connection is achieved via distributed cabling 46, contained with cabinet 10. The rectifiers 42 convert the 480 Vac 3-phase power into 380 Vdc power that will be delivered to the blades. The titanium class rectifiers 42 (96% efficient at half load) are hot swappable and configured in an N+1 configuration for redundancy. The rectifiers also have enough energy storage to maintain output through a 20 ms drop out of the input power. 380 Vdc has multiple advantages; less copper for lower costs and lower weight, as well as the ability to drive the current with lower losses.

Turning now to FIG. 11, the physical structures of the power distribution are more fully illustrated. As indicated above, bus bars 58 provide the AC power to the various PDUs 60. Via distributed cabling 46, conditioned/filtered power signals are provided to rectifier chassis, and specifically to the various rectifiers 42. The output from rectifiers 42 supplies power to the various compute blades and switch blades. This power is distributed appropriately to these components via a chassis bus bar 48, which is specifically designed to cooperate with the above-mentioned chassis configuration. As better illustrated in FIG. 11, each bus bar 48 is an "H"-shaped component, having a horizontal cross member, and vertical side members. As discussed above, compute blade 22 are housed within compute chassis 20 in a vertical manner, and have a centrally located power receptacle. Switch blades 32, however, are contained within switch chassis 30 in a substantially horizontal manner, and have power connectors on one side. As such, power to compute blades 22 will be provided by the horizontal section of the "H"-shaped bus bar 48, while power will be supplied to the switch blades via one of the vertical portions of "H"-shaped bus bar 48. In this manner, no additional cabling or special considerations are required to provide power to any of these components.

As generally discussed above, compute cabinets 10 are fully liquid cooled. No fans or airflow are needed in these racks. To maximize efficiency and reduce the total cost of ownership (TCO), the systems may be cooled with ASHRAE W2 or W4 water delivered to the cooling units. (ASHRAE provides well accepted industry guidelines for liquid cooling, W2 is <80.6 F and W3 is <95 F). In one situation, W2 water provides advantages with possible upside in performance, reliability, and excursion ride-through. This facility-provided water quality should meet Chapter 5 water quality (FWS water quality) as defined in the ASHRAE Liquid Cooling Guidelines. The Cooling Distribution Unit (CDU) 90 to compute loop will be a higher quality water (ASHRAE TCS quality) as needed by the compute cabinet and will be maintained by the Offeror as part of the system service.

This full liquid cooling concept provides maximum cooling efficiency, providing advantages over a hybrid "liquid to the processor, air to the other components" concept. This concept as manifested in the cabinet allows for a denser cabinet and simpler thermal management system. Direct liquid cooling provides a large temperature differential between components and cold plates making it possible to efficiently use warm water cooling to remove heat from the processor, memory, switch, and rectifiers. Other lower powered components will have a conduction path to the coolant loop.

Figure 8:
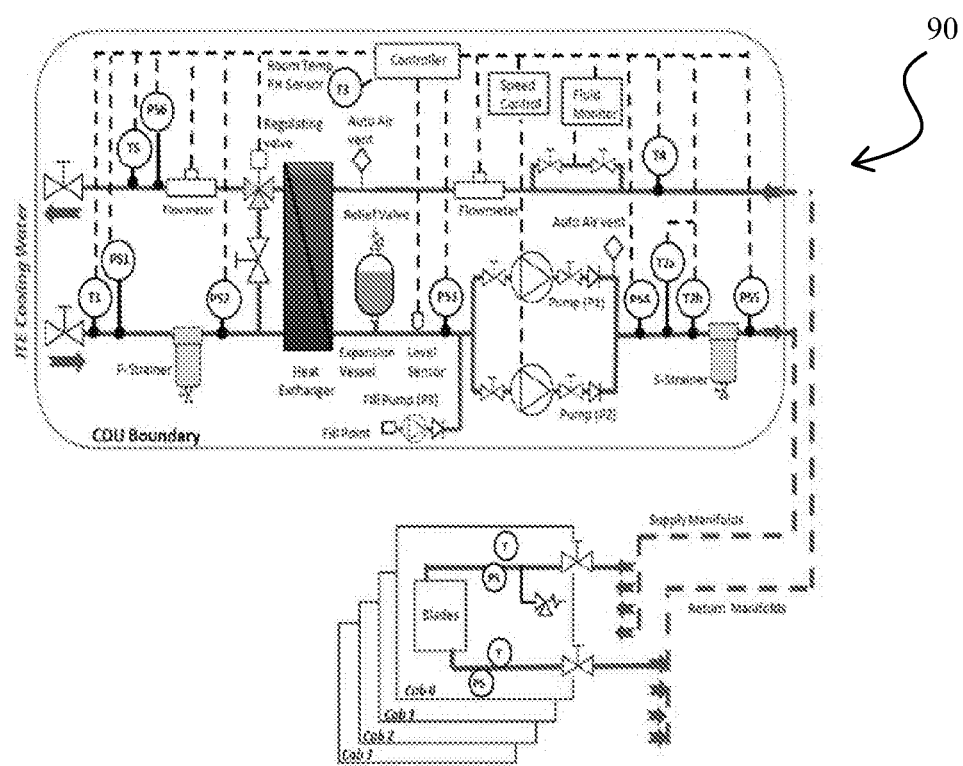
FIG. 8 is a schematic view of one exemplary cooling system.

As shown in FIG. 8, the Cooling Distribution Unit (CDU) 90 separates the IT cooling loop from the facilities cooling loop. Heat exchangers in CDU 90 allow thermal transport while keeping the water streams physically separate. Conditioned water coolant is provided to the compute cabinets by a CDU 90 sized to support the load of four compute cabinets, and is located within the row of cabinets it supports. CDU 90 transfers heat removed from the compute cabinets to the facility water by means of a liquid to liquid heat exchanger whose flow rate is regulated via a control valve in the facility stream. CDU 90 monitors room dew point and regulates the coolant temperature as necessary to ensure the secondary loop temperature is above dew point. Pumps are variable speed, redundant, and designed to permit replacement while the CDU 90 is active.

From a general perspective, the cooling system is specifically designed for efficiency and overall effectiveness. This generally involved equalizing impedance throughout the system where possible so that even flow of fluid is achieved for all blades and other components. In addition, cabinet space is maximized by coupling an efficient fluid distribution system within the cabinet which is appropriately coupled to the CDU. It is clearly anticipated that this fluid distribution system is eventually coupled to the fluid handling mechanisms within each blade, as generally set forth above.

Figure 5:
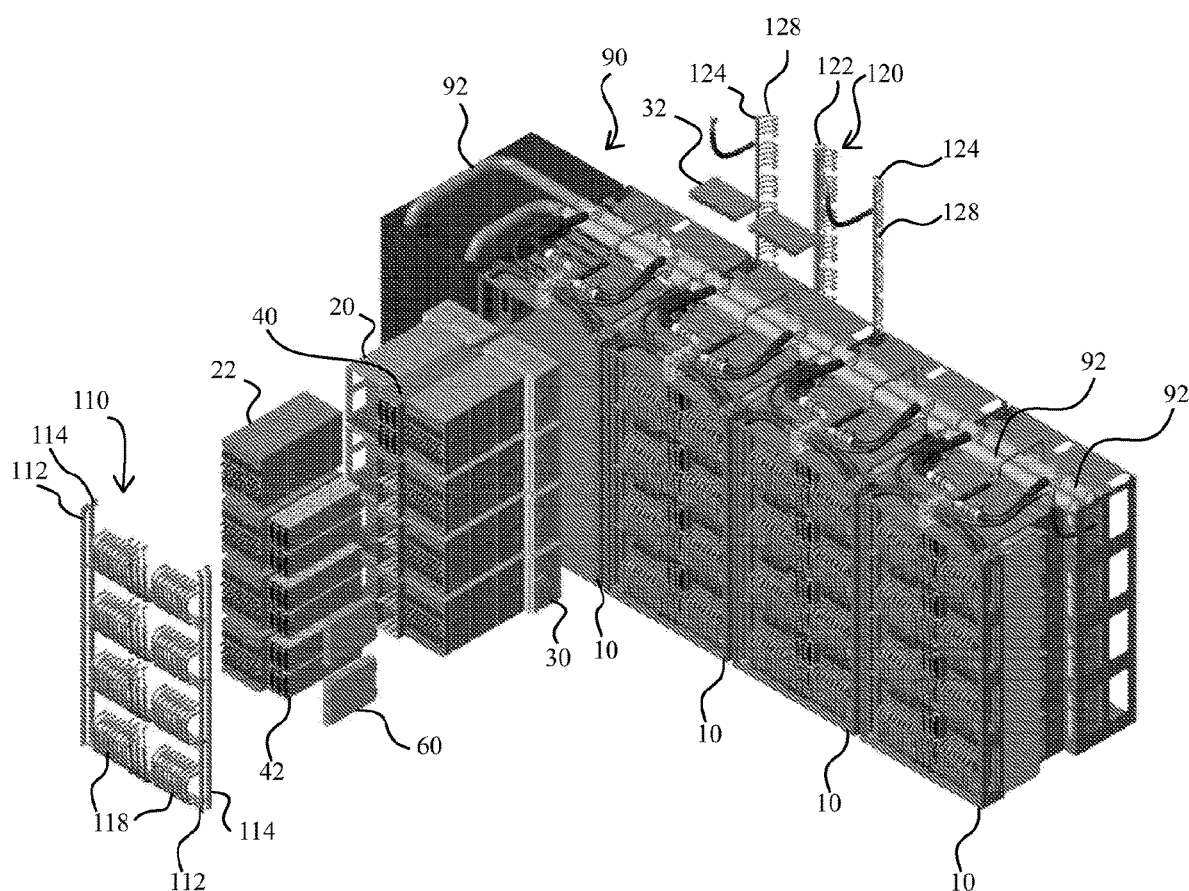
FIG. 5 is a perspective view of an alternative computing system, with one cabinet being showed in exploded view.
Figures 12A, 12B:
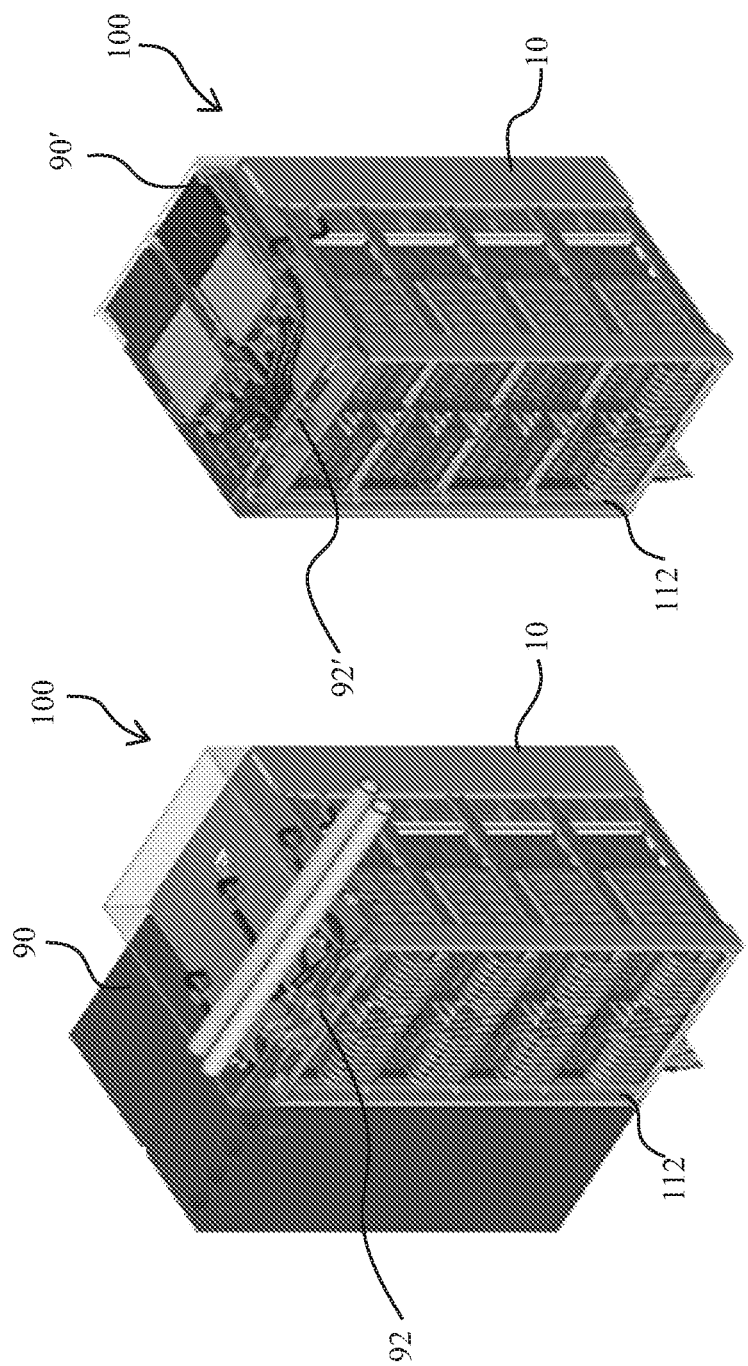
FIG. 12 is a perspective view of two embodiments of the computing system.
Figure 13:
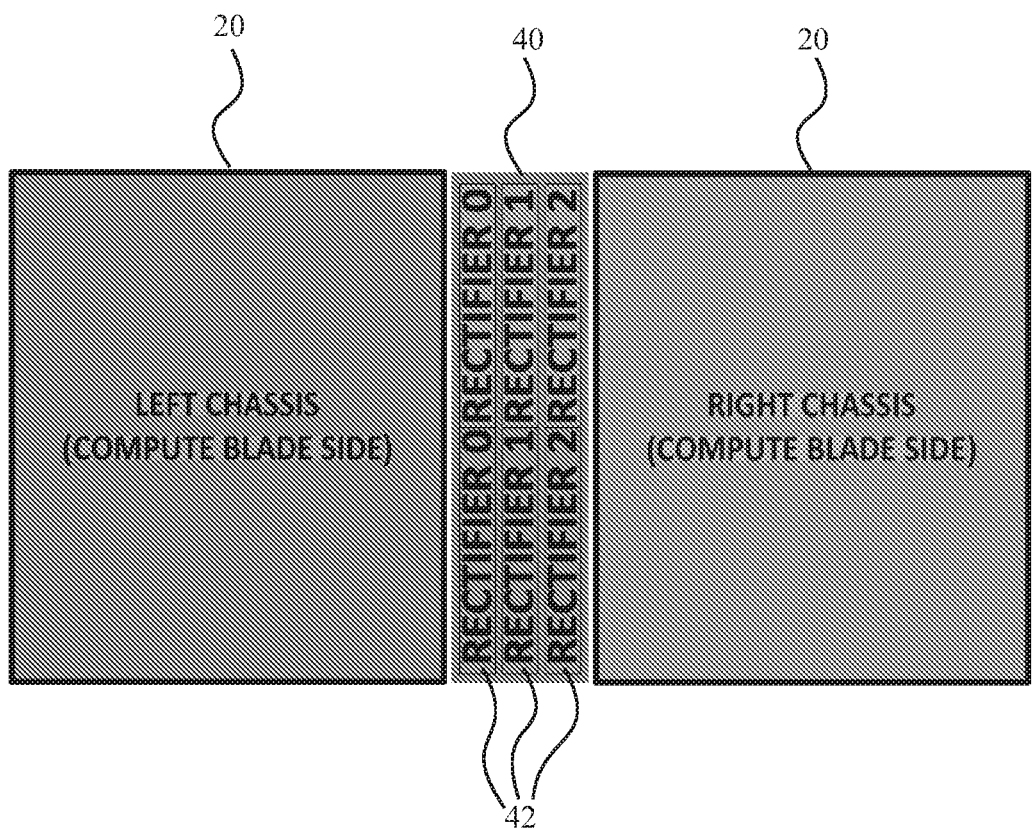
FIG. 13 is a front schematic view of two compute chassis.

As generally illustrated in FIGS. 2 and 5, cooling system or cooling distribution unit (CDU) 90 provides cooling fluid to overhead fluid handling pipes 92 which are generally situated above the cabinet itself. As will be understood, this same type of fluid handling structure (i.e. fluid handling pipes) could be positioned below or behind the various cabinets as well. In addition, alternative embodiments may position the entire CDU above the cabinet. Referring to FIG. 12, these two alternative embodiments are illustrated. In FIG. 12A, the CDU 90 is positioned adjacent to cabinet 10, which is consistent with the various embodiments discussed above. Alternatively, FIG. 12B shows a configuration having the CDU 90' positioned above the cabinet. In some computing environments, floor space is at a premium, thus it may be preferable to incorporate the CDU 90 the above cabinet. As further discussed below, the cooling structures within cabinet 10 allow for both configurations.

To provide appropriate efficiencies and to accommodate various cooling system configurations, each cabinet will include various manifolds which are positioned along both a front side and a back side of the cabinet itself. Referring to FIG. 5, front manifold 110 is used to provide cooling fluid to compute blades 22 and rectifiers 42. Similarly, a rear manifold 112 will distribute cooling fluid to switch blades 32, chassis management modules 50, and any other components. In use, front manifold 110 and rear manifold 120 have main feed lines 112, 122, return lines 114, 124 and a number of connecting cables or connecting hoses 118, 128 attached thereto. The feed lines 112, 122 run adjacent to the compute chassis 20 on a front side, and adjacent to the center portion of switch chassis 30 on a rear side. Related return lines 114, 124 are positioned adjacent the compute chassis 20 on the front side and at an outer edge of switch chassis 30 on a rear side of cabinet 10. The fluid handling hoses 118, 128 will thus be coupled to each blade as needed. In this manner, cooling fluid is provided to each cabinet, and similar systems can be incorporated into adjacent cabinets, as needed.

Again, flexible hoses 118, 128 are coupled to appropriate feed and return lines via mounted dripless quick disconnect (QD) couplings 114 are utilized to transport coolant to the individual compute blades 22, switch blades 32, and rectifier cooling plates. Serviceability for liquid cooling will be provided with dripless QD couplings 114 at the FRU level. Redundancy in cooling units will be provided as needed (e.g. pumps, heat exchangers, filtration, as well as key control and monitoring elements).

Figure 9:
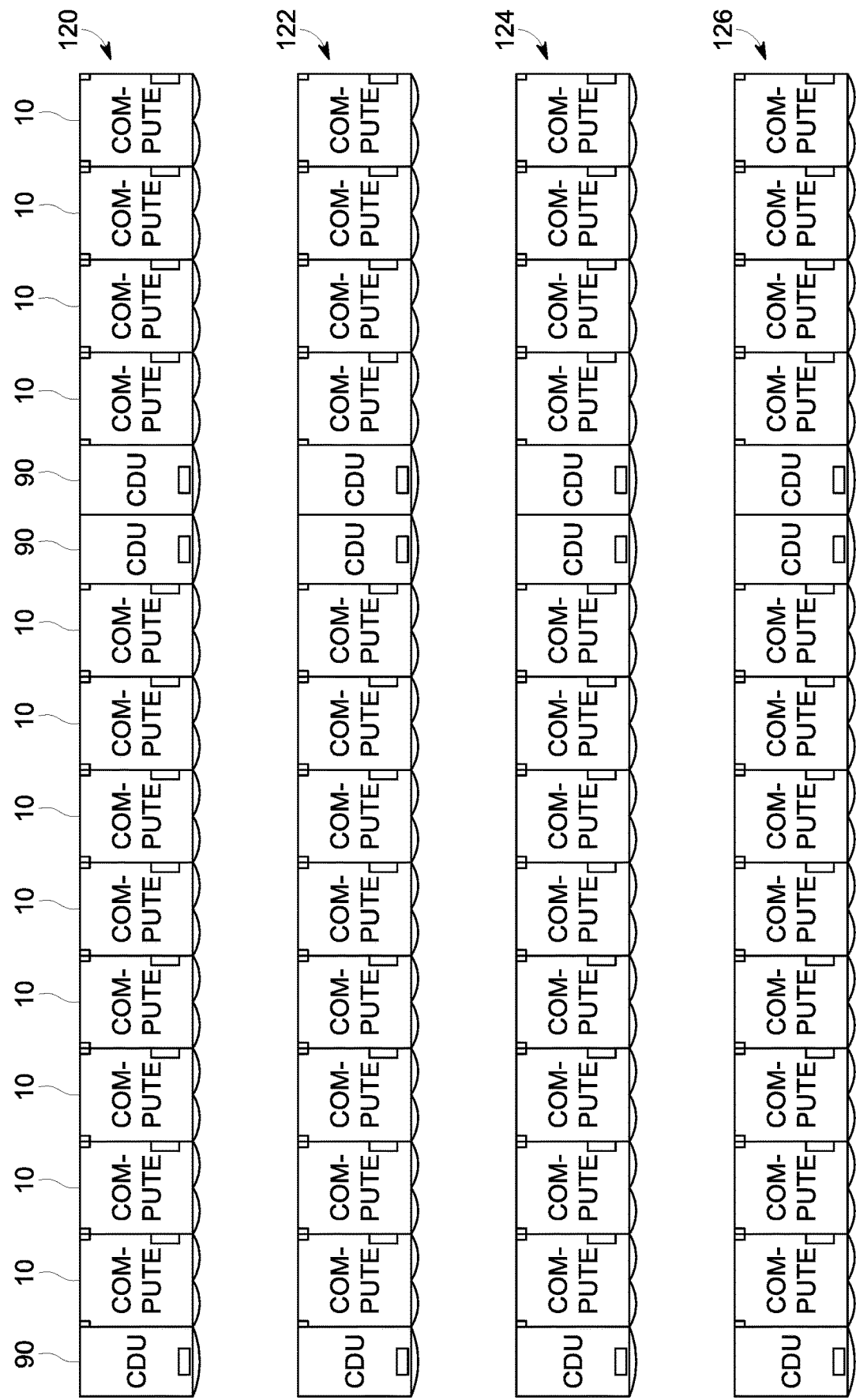
FIG. 9 is a layout diagram for a large scale computing system.

As suggested above, cabinet 10 is configured to be easily usable in a large scale, multi-cabinet installation. One exemplary system is illustrated in FIG. 9, where multiple cabinets 10 and multiple CDU's 90 are arranged to cooperate with one another. As shown, four rows 120-126 of components (i.e. cabinets 10 and CDUs 90) are installed in this embodiment. It is contemplated that the various cabinets 10 are all interconnected to cooperate as one computing system 100. As outlined above, the unique configuration of the cabinets allows for this to be easily completed.

The embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

The invention claimed is:

1. A flexible computing system architecture for supporting an expandable multiprocessor computing system within a computing facility, comprising
   a rack system capable of supporting a plurality of electronic components including a plurality of computing chassis, a plurality of switch chassis, and a plurality of rectifier chassis, wherein each of the plurality of compute chassis are configured to contain a plurality of compute blades, and wherein each of the plurality of switch chassis are configured to contain a plurality of switch blades, and wherein each of the plurality of rectifier chassis are configured to contain at least one rectifier; and wherein the computing chassis and the switch chassis are positioned adjacent one another, such that the compute blades contained within one of the plurality of compute chassis are electronically connected to the switch blades contained within an adjacent one of the switch chassis;
   a power distribution system contained within the rack system, the power distribution system receiving power from a computing facility power supply, and connecting the computing system facility power supply to at least one rectifier contained within the rectifier chassis, the power distribution system further having accommodations for distributing power from the at least one rectifier to the plurality of compute blades and the plurality of switch blades;
   environmental systems cooperating with a heating/cooling distribution system, the environmental system having a manifold system including a front manifold positioned adjacent a front side of the cabinet and rear manifold positioned adjacent a back side of the cabinet to accommodate a flow of cooling fluid received from the heating/cooling distribution system;
   a plurality of flexible hoses removably coupled to the manifold system at a first end, and removably coupled to the compute blades or the switch blades at an opposite end to provide cooling fluid; and
   a chassis management module to coordinate operation of the components contained within at least one switch chassis and at least one compute chassis.

2. The system of claim 1 wherein the cabinet comprises a collection of shelves, with each shelf configured to support a predetermined number of compute chassis, a predetermined number of switch chassis and a predetermined number of rectifier chassis.

3. The system of claim 2 wherein power distribution system comprised a plurality of power distribution units and the shelf is further configured to support at least one power distribution unit.

4. The system of claim 1 further comprising a cabinet environmental control coupled to the environmental systems to coordinate overall cooling of the cabinet.

5. The system of claim 4 wherein the cabinet environmental control is contained within at least one switch chassis.

6. The system of claim 5 wherein the cabinet comprises a collection of shelves, with each shelf configured to support a two compute chassis, two switch chassis, a rectifier chassis and a power distribution unit, with each compute chassis paired with a switch chassis to form a switch chassis/compute chassis pair.

7. The system of claim 6 wherein each switch chassis pair has a corresponding chassis management module contained in the switch chassis.

8. The system of claim 7 wherein power distribution system comprised a plurality of power distribution units and the shelf is further configured to support at least one power distribution unit adjacent to at least one of the compute chassis.

9. The system of claim 8 wherein the compute chassis and the rectifier chassis are accessible from a front side of the cabinet and the switch chassis is accessible from a back side of the cabinet, and wherein the coupling of the compute blades and the switch blades is achieved via connectors situated in a rear portion of the compute blades and the switch blades.

10. The system of claim 9 wherein the front manifold is coupled to the plurality of compute blades and the rear manifold is coupled to the plurality of switch blades via the plurality of flexible hoses.

11. The system of claim 10 wherein the compute blades comprise a plurality of processors for carrying out various compute operations, and the switch blades contain at least one switch to accommodate communication between processors contained within other compute blades.

12. A high performance computing system having multiple processor, comprising:
   a rack system having a plurality of shelves configured to support a plurality of electronic components including a plurality of computing chassis, a plurality of switch chassis, and at least one rectifier chassis, wherein each of the plurality of compute chassis are configured to contain a plurality of compute blades, and wherein each of the plurality of switch chassis are configured to contain a plurality of switch blades, and wherein the plurality of rectifier chassis is configured to contain at least one rectifier; and wherein the computing chassis and the switch chassis are arranged as pairs which are positioned adjacent one another, such that the compute blades contained within one of the plurality of compute chassis are electronically connected to the switch blades contained within a paired switch chassis via connectors situated on the switch blades and the compute blades;
   a power distribution system contained within the rack system, the power distribution system having a plurality of power distribution units configured to receive power from a computing facility power supply, and provide conditioned power to at least one rectifier contained within the rectifier chassis, the power distribution system further having accommodations for distributing power from the at least one rectifier to the plurality of compute blades and the plurality of switch blades, each of the power distribution units being supported by at least one shelf;
   environmental systems cooperating with a heating/cooling distribution system, the environmental system having a manifold system including a front manifold positioned adjacent a front side of the cabinet and rear manifold positioned adjacent a back side of the cabinet to accommodate a flow of cooling fluid received from the heating/cooling distribution system, the environmental system further having a cabinet environmental control to control the flow of cooling fluid within the cabinet;
   a plurality of flexible hoses removably coupled to the manifold system at a first end, and removably coupled to the compute blades or the switch blades at an opposite end to provide cooling fluid; and a chassis management module to coordinate operation of the components contained within at least one switch chassis and at least one compute chassis.

13. The system of claim 12 wherein each shelf configured to support a two of the compute chassis, two of the switch chassis, the rectifier chassis and the power distribution unit, with each compute chassis paired with a switch chassis to form a switch chassis/compute chassis pair, and wherein each switch chassis/compute chassis pair has a chassis management module cooperating with the compute blades and switch blades contained within the switch chassis/compute chassis pair.

14. The system of claim 13 wherein the compute chassis and the rectifier chassis are accessible from a front side of the cabinet and the switch chassis is accessible from a back side of the cabinet, and wherein the coupling of the compute blades and the switch blades is achieved via connectors situated in a rear portion of the compute blades and the switch blades; and wherein the front manifold is coupled to the plurality of compute blades and the rear manifold is coupled to the plurality of switch blades via the plurality of flexible hoses.

* * * * *